(12) United States Patent
Bonora et al.

(10) Patent No.: US 7,661,919 B2
(45) Date of Patent: Feb. 16, 2010

(54) DISCONTINUOUS CONVEYOR SYSTEM

(75) Inventors: Anthony C. Bonora, Portola Valley, CA (US); Ted Rogers, Fremont, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 500 days.

(21) Appl. No.: 11/238,030

(22) Filed: Sep. 28, 2005

(65) Prior Publication Data

US 2007/0081879 A1    Apr. 12, 2007

(51) Int. Cl.
*H01L 21/677* (2006.01)

(52) U.S. Cl. .................................. 414/222.01

(58) Field of Classification Search ................. 414/435, 414/473, 477, 222.01, 222.09; 198/464.4
See application file for complete search history.

(56) References Cited

U.S. PATENT DOCUMENTS

| | | | | |
|---|---|---|---|---|
| 5,980,183 | A * | 11/1999 | Fosnight | 414/222.01 |
| 6,283,692 | B1 * | 9/2001 | Perlov et al. | 414/222.01 |
| 6,336,546 | B1 * | 1/2002 | Lorenz | 198/346.2 |
| 6,435,330 | B1 | 8/2002 | Bonora et al. | |
| 6,468,021 | B1 | 10/2002 | Bonora et al. | |
| 6,481,558 | B1 | 11/2002 | Bonora et al. | |
| 6,663,340 | B1 | 12/2003 | Zeakes et al. | |
| 6,677,690 | B2 | 1/2004 | Fosnight et al. | |
| 6,681,916 | B2 * | 1/2004 | Hiroki | 198/347.1 |
| 2003/0040841 | A1 | 2/2003 | Nasr et al. | |
| 2003/0198553 | A1 | 10/2003 | Lin et al. | |
| 2004/0081538 | A1 | 4/2004 | Rice et al. | |
| 2004/0126208 | A1 | 7/2004 | Tawyer et al. | |

FOREIGN PATENT DOCUMENTS

| | | |
|---|---|---|
| WO | WO 98/46503 | 10/1998 |
| WO | WO 00/33355 | 6/2000 |

OTHER PUBLICATIONS

"ITRS 2003 Factory Integration Chapter Material Handling Backup Section," International Technology Roadmap for Semiconductors, Date Considered: Sep. 4, 2003.

* cited by examiner

*Primary Examiner*—Charles A Fox
(74) *Attorney, Agent, or Firm*—Fish & Richardson P.C.

(57) ABSTRACT

The present invention generally comprises a transport system for transporting containers throughout a fabrication facility, and more specifically through a tool bay in the fabrication facility. The present invention generally includes a first container transport system for transporting a container from an interbay conveyor towards the first tool bay, a second container transport system for moving a container away from the first tool bay and a tool loading device to move containers between the first and second container transport systems and a load port. A merged return conveyor for transporting a container between the second container transport system and the interbay conveyor may also be included.

9 Claims, 7 Drawing Sheets

DISCONTINUOUS CONVEYOR SYSTEM

FIELD OF THE INVENTION

The present invention generally relates to a container delivery system. More specifically, the present invention comprises an interbay conveyor system having a container delivery device for moving containers between a first material transport system, a second material transport system and a load port of a processing tool.

BACKGROUND OF THE INVENTION

Manufacturing of semiconductor devices typically involves performing a sequence of procedures with respect to a substrate, such as silicon substrate, glass plate, etc. These steps may include polishing, deposition, etching, photolithography, heat treatment, and so forth. It is generally the case that other processes are required to be performed at other processing locations within a fabrication facility, and it is therefore necessary to transport the substrates within the fabrication facility from one processing location to another. Depending upon the type of semiconductor device to be manufactured, there may be a relatively large number of processing steps required to be performed at a considerable number of different processing locations within the fabrication facility.

Substrates are conventionally transported from one processing location to another within substrate carriers such as sealed pods, cassettes, containers and so forth. It is also conventional to employ automated container transport devices, such as automatic guided vehicles (AGVs), overhead transport (OHT) systems, container handling robots, etc., to move containers from location to location within the fabrication facility.

Overhead conveyor delivery of wafer containers, such as front-opening unified pods (FOUPs), in a semiconductor fabrication facility (fab) has many advantages over hoist delivery due to the complexity of OHT vehicle management. However, transferring FOUPs from the conveyor to a tool load port currently requires multiple mechanisms. These mechanisms reduce container throughput in the fab as well as add cost and complexity to the container transfer system.

A conventional ceiling mounted conveyor travels down the length of a tool bay. Lift mechanisms are located along the conveyor for raising a FOUP off the conveyor. Port loading mechanisms remove FOUPs from the lift mechanism to a port or shelf located to the side of the conveyor. After the FOUP has been removed from the conveyor, other FOUPs traveling on the conveyor may then resume travel on that section of conveyor. And at some later time, a mechanism will transfer the FOUP from the port or shelf to a tool load port. A second FOUP cannot be removed from the conveyor and placed on the same port until the port has been cleared (e.g., the first FOUP must be moved from the port to a tool load port). A tool bay often requires multiple sets of lift mechanisms and ports to prevent the possibility of having all ports full at the same time. If this happens, traffic on the conveyor will stop until there is a place to unload a waiting FOUP, resulting in the conveyor being congested with FOUPs.

Conventional FOUP conveyor buffers are either first-in-first-out (FIFO), first-in-last-out (FILO), or require shifting all FOUPs (e.g., circular buffer) to retrieve one FOUP. Each of these conveyor buffers allows a FOUP, only in one designated location, to be accessed by a container transport device. The transport device often sits idle while waiting for another FOUP to arrive at the designated location. In addition, these conventional systems may require first moving a FOUP from the conveyor to a shelf adjacent a processing tool, and then from the shelf to a load port. This additional step imposes a time delay, or limits access to, the load ports—which reduces the system's maximum container throughput.

Therefore, there is a need for a conveyor buffer system whereby FOUPs located on the buffer system may be randomly accessed. There is also a need for a tool loading device that transports a FOUP from the conveyor directly to a load port of a processing tool.

SUMMARY OF THE INVENTION

One aspect of the present invention is to provide a material transport system that simplifies the tool loading interface between a tool bay and, for example, a conveyor. In general, the conveyor system eliminates the need for separate lift and translate mechanisms typically required for loading/unloading FOUPs from the conveyor to a shelf and moving the FOUP from the shelf to a processing tool. In one embodiment, the present invention comprises an input conveyor stub horizontally aligned in substantially the same vertical plane as the container advance plate of each load port in the tool bay. A tool loading device, using substantially only movement along the Z-direction and the X-direction within a common vertical plane, transports FOUPs directly between the input conveyor stub and a processing tool load port.

Yet another aspect of the present invention is to provide a container buffer system that does not utilize fab floor space to provide FOUP storage near the destination tool. In one embodiment, the conveyor system includes an input conveyor stub for transporting FOUPs from the interbay conveyor or nearby stocker into a tool bay. The input conveyor stub also provides a buffer area for storing FOUPs. In another embodiment, the conveyor system further includes an exit conveyor stub for storing FOUPs exiting the tool bay. In yet another embodiment, the conveyor system includes a merged return conveyor that transport FOUPs, which have exited the tool bay, back to the interbay conveyor. In the case that the interbay conveyor is not operating, the merged return conveyor may also store FOUPs.

Another aspect of the present invention is to improve container throughput of the material transport system. In one embodiment, a tool loading device transports FOUPs directly between the input conveyor stub and a processing tool. In one embodiment, an input conveyor stub is substantially horizontally aligned with each load port within a common vertical plane. Eliminating conventional stockers and storage shelves reduces the FOUP delivery time from a conveyor to a processing tool. In one embodiment, the tool loading device moves the FOUPs between a conveyor stub and a processing tool along only an X direction and substantially within a common vertical plane.

Another aspect of the present invention is to provide a material transport system that compliments an OHT system. In one embodiment, the present invention includes a FOUP delivery system that uses an OHT car or cars as the tool loading device, either by employing traditional circulating cars, or by use of a single reciprocating car that shuttles back and forth along the length of the bay to move FOUPs between the input conveyor, the output conveyor, and the processing tools.

DETAILED DESCRIPTION OF THE INVENTION

The embodiments of this invention are described and illustrated as moving FOUPs throughout a semiconductor fabrication facility. However, the present invention is not limited to FOUPs and/or semiconductor manufacturing. For purposes of describing this invention, A FOUP generally represents, by way of example only, wafer containers (with walls and without), cassettes, flat panel displays, Standard Mechanical Interface (SMIF) pods, or any substrate structure for supporting a substrate, whether the structure supports a single substrate or multiple substrates.

Figure 1:
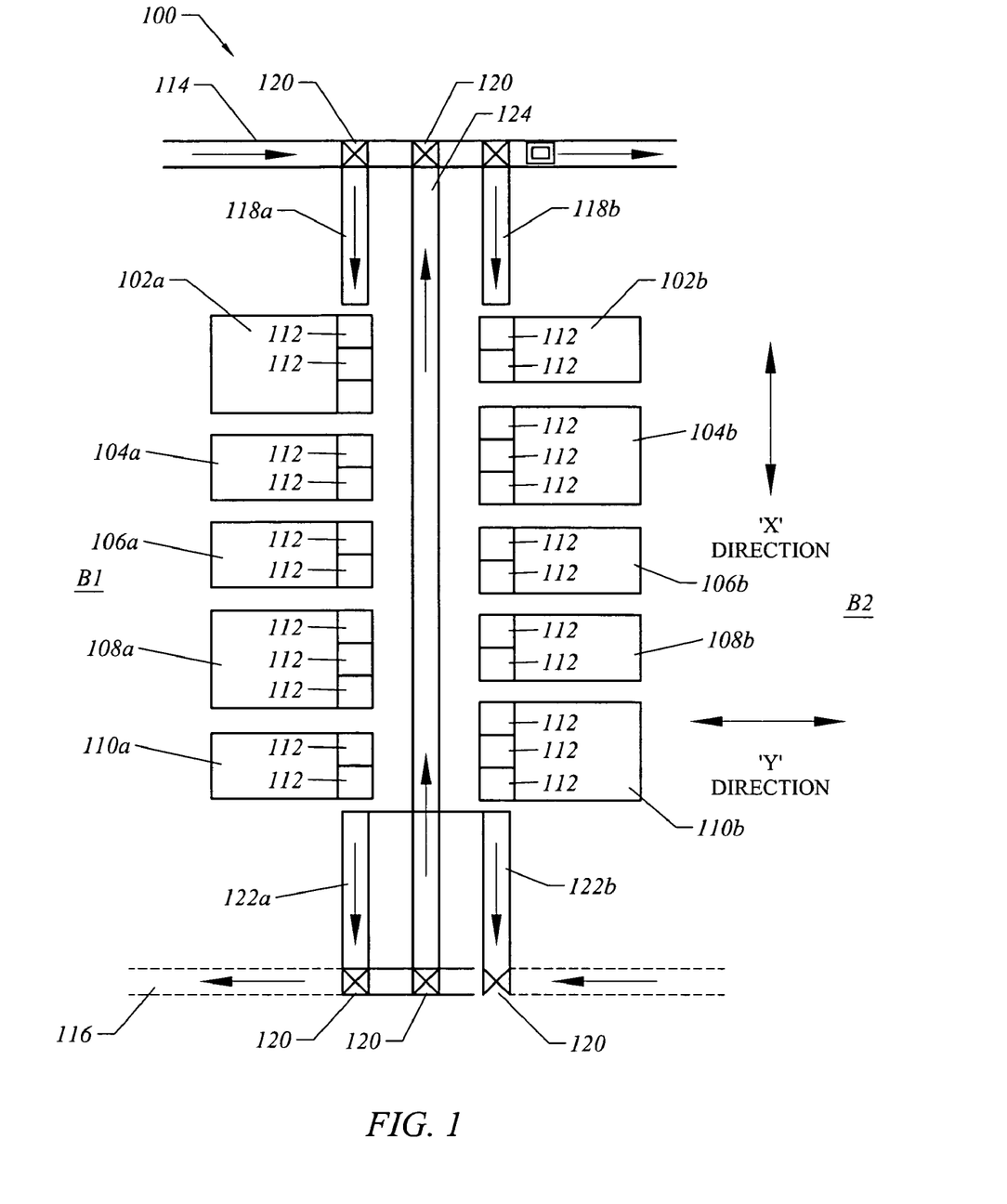
FIG. 1 provides a plan view of an embodiment of the present invention.

FIG. 1 illustrates one embodiment of a material transport system 100 according to the present invention. In this embodiment, an interbay conveyor 114 delivers FOUPs 12 between two bays B1 and B2. Each tool bay includes multiple processing tools 102. For example, as shown in FIG. 1, tool bay B1 includes processing tools 102a, 104a, 106a, 108a and 110a, and tool bay B2 includes processing tools 102b, 104b, 106b, 108b and 110b. Each processing tool 102 includes one or more load ports 112 for presenting substrates (or other materials) stored in a FOUP 12 to the processing tool 102 The scope of the present invention is not limited to this configuration.

The material transport system 100, in some cases, includes an alternative interbay conveyor 116. Both of these interbay conveyors have the ability to transport a FOUP past bays B1 and B2 to other locations elsewhere in the semiconductor fabrication facility. Extending from the interbay conveyor 114 are two first material transport systems or input conveyor stubs 118a and 118b. Each input conveyor stub 118 comprises a conveyor for simultaneously buffering multiple FOUPs. The length of each input conveyor stub 118 determines how many FOUPs may be stored on a stub 118 at the same time.

Each tool bay B1 and B2 may also include a second material transport system or an exit conveyor stub 122 that the tool loading mechanism 152 (see below) places FOUPs on exiting the tool bay. If the material transport system 100 does not include an interbay conveyor 116, each exit conveyor stub 122 preferably merges into a single return conveyor 124. The return conveyor 124 transport FOUPs that have exited a tool bay back to the interbay conveyor 114. The merged return conveyor 124 may also buffer FOUPs.

If the material transport system 100 includes an alternate interbay conveyor 116, each exit conveyor stub 122 could load a FOUP 12 onto the alternate interbay conveyor 116. In this embodiment, the material transport system 100 would have the option of transporting the FOUP to the next tool bay by the alternate interbay conveyor 116 or by first retuning the FOUP to the interbay conveyor 114 by the merged return conveyor 124 and then sending the FOUP to the tool bay. The merged return conveyor 124 could also be eliminated altogether. If there is no merged return conveyor 124, it may be desirable to increase the length of each exit conveyor stub 122 to provide additional buffering capacity. As with each input conveyor stub 118, each exit conveyor stub 122 could be extended over the process tools 102-110 if the tool loading mechanism is able to access these tools under the conveyor.

The conveyors described in this invention may comprise any conveyor known to one skilled in the art of transporting containers throughout fabrication and/or manufacturing facilities. For example, the conveyors may comprise a conveyor system similar to the conveyor disclosed in U.S. Pat. No. 6,308,818, entitled "Transport System with Integrated Transport Carrier and Directors," which is assigned to Asyst Technologies, Inc., and is incorporated herein by reference.

In one embodiment of the material transport system 100, a director assembly 120 is located at each intersection between the interbay conveyor 114 and each input conveyor stub 118 and the merged return conveyor 124. One example of a director assembly 120 is disclosed in U.S. Pat. No. 6,308,818, referenced above. In general, the director assembly 120 is any mechanism that rotates a FOUP from one orientation to another. In one embodiment, after the FOUP is rotated, the FOUP then advances onto an input conveyor stub 118. In a preferred embodiment, the director assembly 120 rotates each FOUP ninety degrees such that the FOUP door faces the port door of a load port 112 when the FOUP is loaded onto the load port 112. Rotating the FOUP at this point (before the FOUP is moved onto the input conveyor stub 118) eliminates any need to further rotate the FOUP to access the workpieces within the FOUP. The material transport system 100, of course, is not limited to this configuration.

A FOUP 12 does not have to be rotated before it is transported from the interbay conveyor 114 to an input conveyor stub 118. A FOUP 12 may be transferred onto the input conveyor stub 118 in any alignment. It is not even necessary to align each FOUP 12 on the input conveyor stub 118 in the same direction. Each FOUP 12 must eventually be rotated so that the FOUP door faces the port door when the FOUP is set on the tool load port. For example, a director assembly 120 may be located at the end of an input conveyor stub 118, the tool loding device may have a rotating gripper, or the load port may have a rotating pod advance plate.

The exit conveyor stubs 122a and 122b, in one embodiment, are located at the opposite end of each tool bay B1 and B2 from the input conveyor stubs 118a and 118b. The exit conveyor stubs 122 connect to the alternative interbay conveyor 116 and/or the merged return conveyor 124. In the FIG. 1 embodiment, a FOUP placed on the merged return conveyor 124 is returned back to the interbay conveyor 114. It is within the scope of the invention for the merged return conveyor 124 to transport FOUPs towards either the interbay conveyor 114 and/or the alternative interbay conveyor 116. As shown in FIG. 1, a director assembly 120 may also be placed at each intersection of the exit conveyor stub 122 and the alternate interbay conveyor 116. These director assemblies 120 are not necessary.

FOUPs are queued on the input and exit conveyor stubs with the intention that each conveyor stub forms a storage buffer near the processing tools in each tool bay. As a buffer, each conveyor stub may have stationary FOUPs on it much of the time. Therefore, each conveyor stub is preferably not part of either the interbay conveyor 114 conveyor or the alternative interbay conveyor 116, which are each intended for normal through traffic of FOUPs.

FIG. 1 illustrates that the input conveyor stubs 118a and 118b are horizontally aligned with the tool load ports 112—allowing the tool loading device 152 to transfer FOUPs between an input conveyor stub 118 and the load ports using substantially only vertical (or Z-direction) motion and horizontal (or X-direction) motion. In one embodiment, multiple FOUPs are placed on each input conveyor stub 118 and each FOUP is retrieved in sequence—functioning as a first-in, first-out (FIFO) buffer. If the tool loading mechanism 150 can access tools located directly under the input conveyor stub 118, then the conveyor stubs 118a and 118b could be extended over one or more tools.

Figure 2:
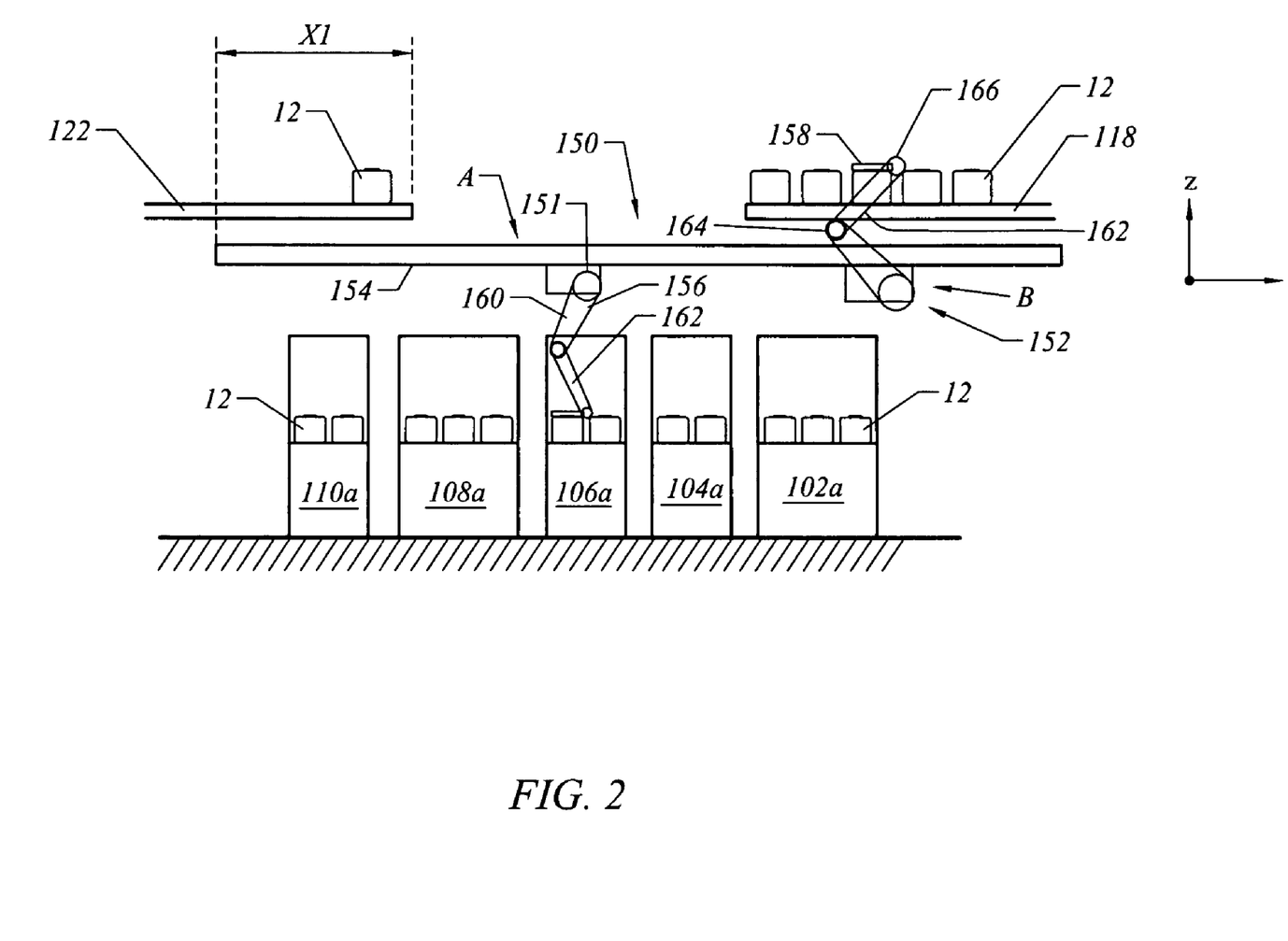
FIG. 2 provides a side view of an embodiment of the present invention, illustrating a container transfer mechanism for moving containers between processing tools and/or conveyors.

FIG. 2 illustrates one embodiment of a tool loading mechanism 150 for moving FOUPs between the processing tools and the input/exit conveyor stubs. In this embodiment, the tool loading mechanism 150 includes a tool loading device 152 that travels along a track 154. FIG. 2 illustrates the tool loading device 152 in two different positions—a processing tool loading/unloading position A and a conveyor stub loading/unloading position B. Position A illustrates the tool loading device 152 placing and/or removing a FOUP 12 from the processing tool 106a. Position B illustrates the tool loading device 152 placing and/or removing a FOUP 12 from the input conveyor stub 118. FIG. 2 only shows processing tools 102a-110a. However, a similar tool loading mechanism 150 may also be dedicated to processing tools 102b-110b. It is within the scope of the present invention to utilize other transfer tools to move FOUPs between the processing tools and/or between the input and exit conveyor stubs and the processing tools.

Track 154 preferably extends, at a minimum, over substantially all of the processing tools 102-110. FIG. 2 illustrates that the track 154 preferably extends beyond at least a portion of the input conveyor stub 118 and the exit conveyor stub 122. By way of example only, FIG. 2 illustrates that the track 154 overlaps a distance X1 with the exit conveyor stub 122 and a similar distance with the input conveyor stub 118. The overlap between the track 154 and the input and/or exit conveyor stub may vary and is not required to be identical distances. As will discussed later, the overlap between the track 154 and, for example, the input conveyor stub 118a, allows the tool loading device 152 to access any of the FOUPs located on the input conveyor stub 118a.

The tool loading device 152, by moving its body 151 along track 154 in the X direction and moving the arms 160 and 162 within a common vertical plane, is able to access a FOUP 12 on the input conveyor stub 118 and place the FOUP 12 on any one of the load ports 112. The loading device 152 moves FOUPs 12 between two load ports 112 (e.g., from processing tool 104a to processing tool 106a), between a load port 112 and the exit conveyor stub 122, or if required, directly between the input conveyor stub 118 and the exit conveyor stub 122. It is also within the scope of the invention for the material transport system 100 to include storage shelves (not shown) located, for example, between load ports for temporarily storing FOUPs closer to a specific load port. One example of storage shelves is disclosed in U.S. Pat. No. 5,980,183, entitled "Integrated Intrabay Buffer, Storage and Delivery System," which is assigned to Asyst Technologies, Inc., and is incorporated herein by reference. It is also within the scope of the invention for the system to include load ports on which facility operators can manually place a FOUP to insert the FOUP into the system. The tool loading device 152 would be adapted to access these additional storage areas too.

Rotatably attached to the body 151 is an arm 156 having a first arm 160 and a second arm 162. It is within the scope of the present invention for the two arms 160 and 162 to either move independently of each other or move in a fixed relationship to each other. The two arms 160, 162 are connected by an elbow joint 164. A gripper 158 is attached to the second arm 162 by a wrist joint 166. The gripper 158, in this embodiment, secures each FOUP 12 by the FOUP's top handle. The tool loading device 152 shown in FIG. 2 is only one embodiment, and may have other configurations.

Figure 3:
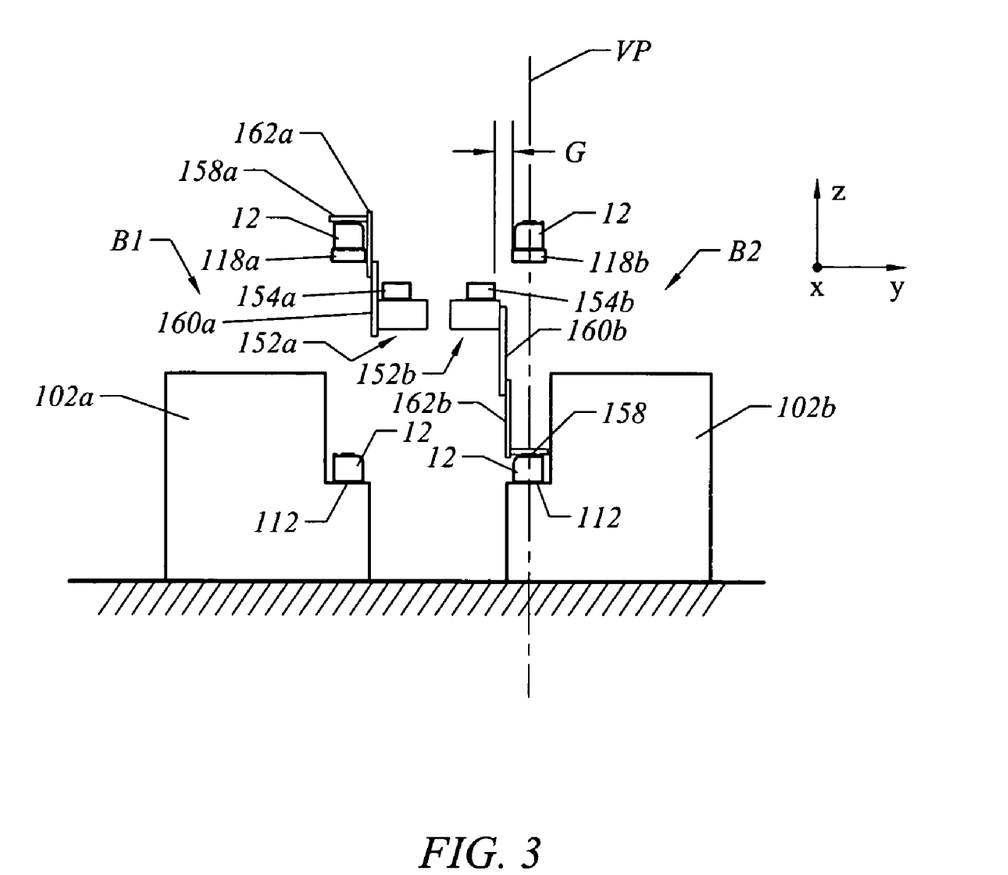
FIG. 3 provides an end view of an embodiment of the present invention, illustrating an end view of the embodiment shown in FIG. 1.

FIG. 3 illustrates that, in one embodiment, the tool loading device 152 may be horizontally offset in the Y-direction with the load ports 112. The loading device 152 may also move a FOUP along the Y-direction and/or rotate the FOUP in order to align the FOUP with the load port. Transferring a FOUP between the input conveyor stub 118a and a processing tool with substantially only Z-direction and X-direction motion requires aligning each input conveyor stub 118 substantially over each of the load port 112 of each processing tool (e.g., substantially within the same vertical plane as the center of each load port). For example, input conveyor stub 118b is substantially horizontally aligned (along the Y-direction) with the load port 112 of processing tool 102b (see vertical plane VP).

In this embodiment, each track 154 is horizontally offset from the input conveyor stubs 118 along the Y direction leaving a gap G between the track 154 and the input conveyor stub 118. The gap G provides a space for the arms of the loading device 152 to operate within. FIG. 3 illustrates the loading device 152a located in position A and the loading device 152b located in position B. The loading device 152a has its gripper mechanism 158a raised to remove or place a FOUP 12 on the input conveyor stub 118a. The loading device 152b has lowered a FOUP 12 onto a load port 112 of the processing tool 102b. Loading device 152a illustrates that the arms 160, 162 fit between the gap G when the arms are raised to position A. The gap G may be any distance as long as the gripper 158 can secure a FOUP located on either the input or exit conveyor stub and the conveyor stubs are substantially vertically aligned with the load ports.

Figure 4:
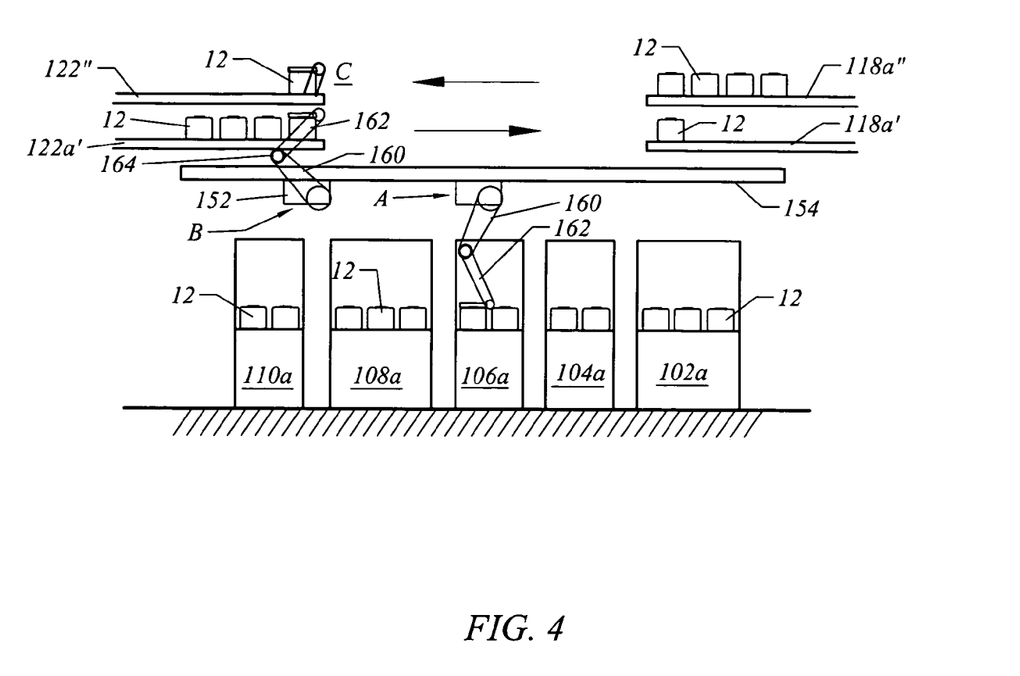
FIG. 4 provides a side view of an embodiment of the present invention, illustrating a dual level input and exit conveyor stub.

FIG. 4 illustrates another embodiment of the present invention. In this embodiment, the input conveyor stub 118 and the exit conveyor stub 122 each comprise a two-level conveyor system. Here, the input conveyor 118a includes a first input conveyor 118a' and a second input conveyor 118a". The exit conveyor stub 122a includes a first conveyor 122a' and a second conveyor 122a". The input conveyor stub 118a and the exit conveyor stub 122a are not required to have the identical number of levels (e.g., input conveyor stub 118a may have two levels while exit conveyor stub 122a has one level). It is also within the scope of the present invention for a multi-level conveyor to comprise both an input conveyor and an exit conveyor, both at one end of a bay. For example, conveyor stub 118a' may comprise an input conveyor stub while the conveyor stub 118a" may comprise an exit conveyor stub. Thus, the material transport system 100 would not need the exit conveyor stubs 122a', 122a" or the system may include two sets of input and exit conveyors—one pair on each side of the tool bay.

FIG. 4 illustrates the tool loading device 152 located in positions A, B and C. In position A, the loading device 152 is placing/removing a FOUP 12 from a load port of processing tool 106a. In position B, the loading device 152 is placing/removing a FOUP 12 from the first exit conveyor stub 122a'. In position C, the loading device 152 is placing/removing a FOUP 12 from the second exit conveyor stub 122a". All of these functions are performed by moving the loading device 152 along a single track 154 in the X direction and moving the arms 160 and 162 vertically within a substantially vertical plane.

Figure 5:
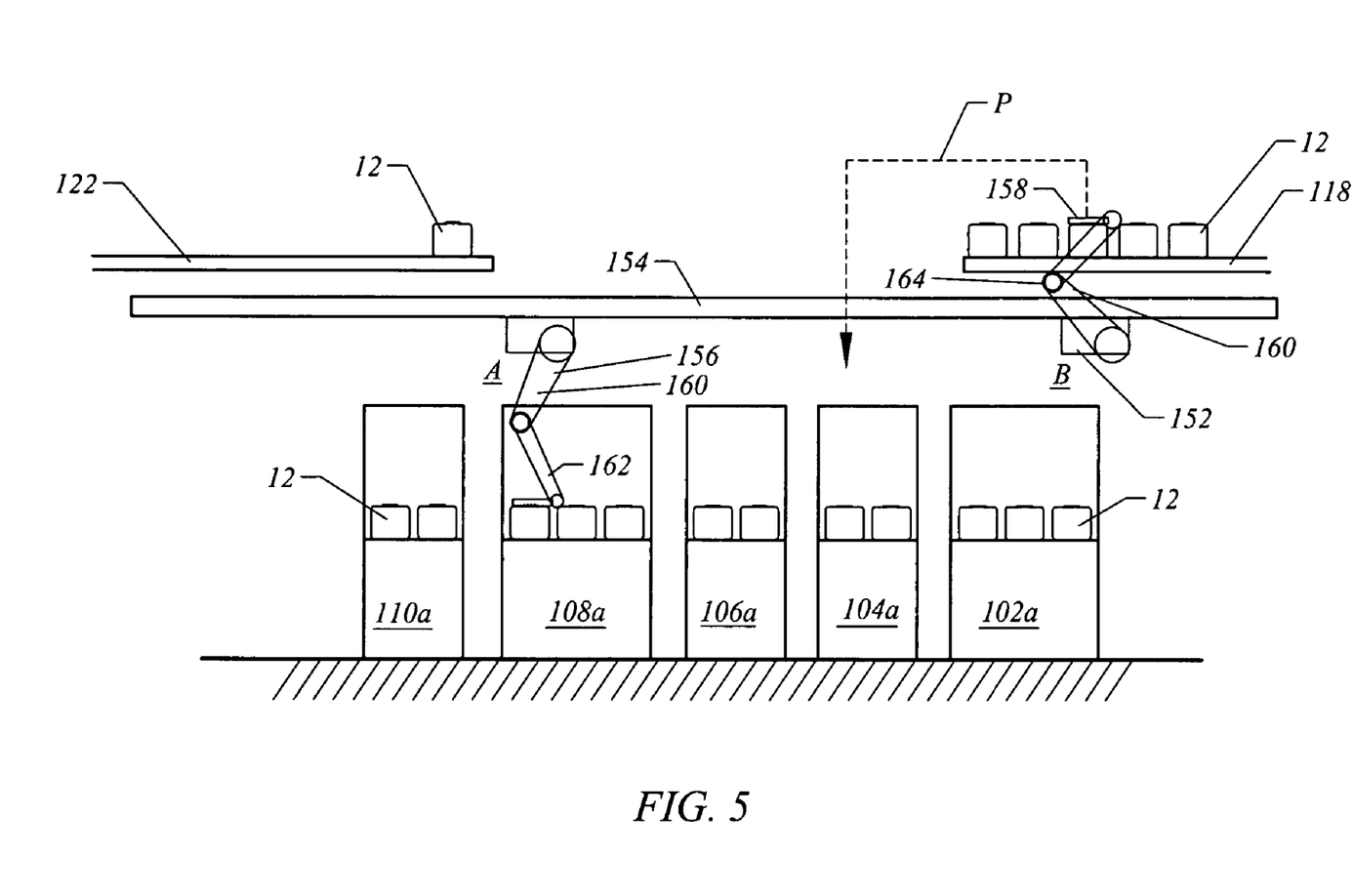
FIG. 5 provides a side view of an embodiment of the present invention, illustrating that the container transfer mechanism shown in FIG. 2 is able to engage any one of the containers located on the input or exit stub.

FIG. 5 illustrates that the tool loading device 152 may access any one of the FOUPs 12 located on the input conveyor stub 118a. To remove a FOUP 12 from the input conveyor stub 118a that is located between other FOUPs, the tool loading device 152 first lifts the FOUP off the input conveyor stub 118a to a height whereby the bottom of the lifted FOUP clears the tops of the other FOUPs resting on the input conveyor stub 118a. The loading device 152 then moves the FOUP 12 horizontally over the other FOUPs on the input conveyor stub 118a and subsequently lowers the FOUP onto a load port of a processing tool. This movement is shown in FIG. 5 as path P. The loading device 152 may also set a FOUP 12 on the exit conveyor stub 122a in between other FOUPs located on the exit conveyor stub 122a.

Figure 6:
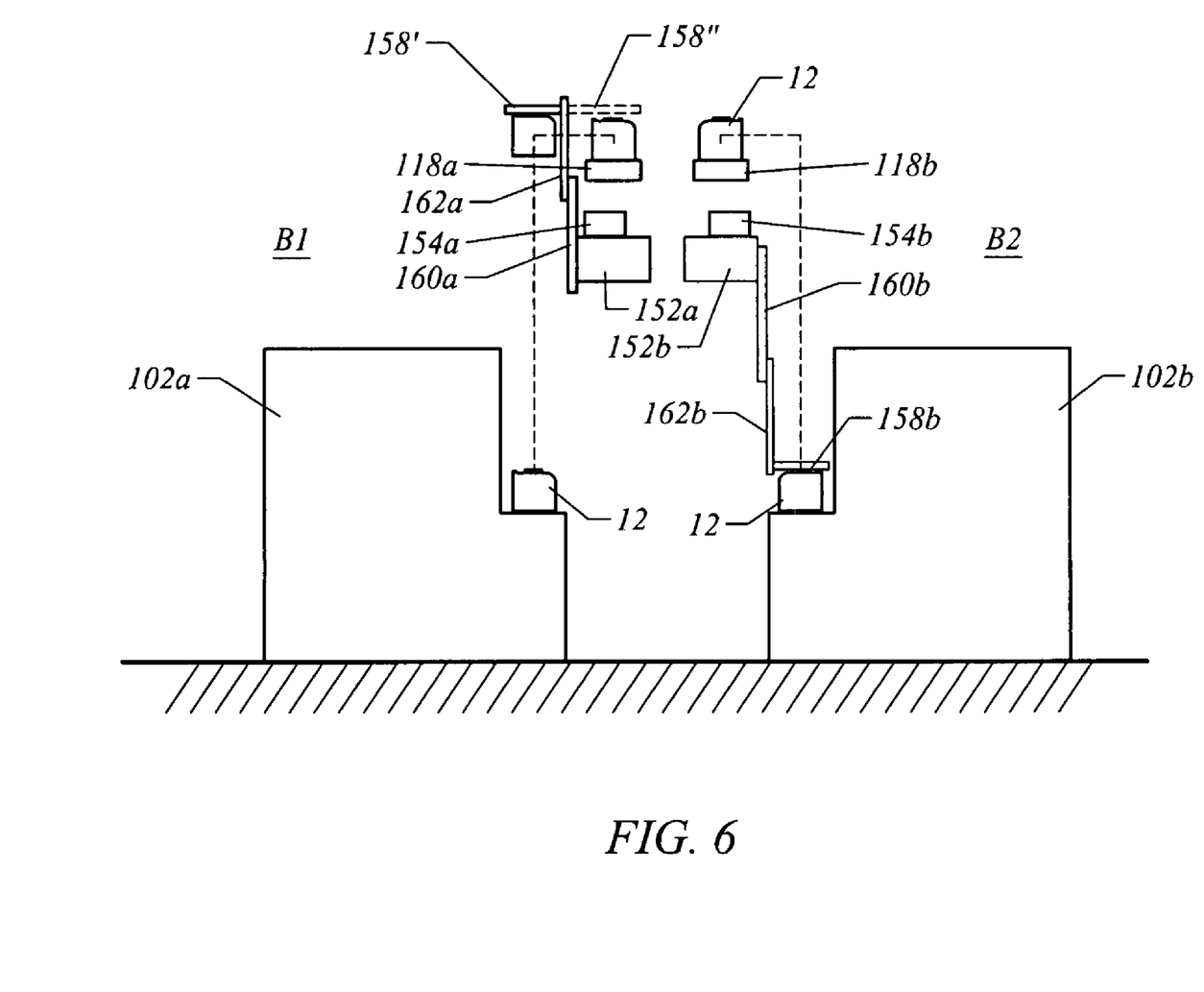
FIG. 6 provides an end view of an embodiment of the present invention, illustrating the motion of the container transfer mechanism.

FIG. 6 illustrates another embodiment of the present invention. In this embodiment, the input conveyor stub 118 and exit conveyor stub 122 are each substantially vertically aligned with the track 154. The tool loading device 152, in this embodiment, moves the FOUP horizontally in the Y-direction in order to transfer a FOUP 12 from the input conveyor stub 118 to a load port. In one embodiment, the loading device 152 includes a mechanism for translating the gripper 158 along the Y-direction. In operation, the loading device 152 first travels along the X direction to a location adjacent a specific FOUP. After the arms 160 and 162 extend upward to align the gripper 158 with the FOUP handle (see gripper 158' in FIG. 6), the gripper 158 is then translated along the Y direction to the position shown by gripper position 158". The gripper 158" then grips the FOUP 12. Before lowering the FOUP 12 or moving the FOUP along the X direction, the gripper 158" is preferably moved back to gripper position 158'. The loading device 152 is then free to move in the X direction without the gripped FOUP colliding with another FOUP, or move the FOUP vertically down to a lower height (e.g., below the track 154). In another embodiment, the gripper 158 is rotated between position 158' and 158" to effectively move the FOUP along the Y-direction.

The gripper position 158' is preferably horizontally aligned with each processing tool load port 12—similar to the embodiment shown in FIG. 3. This way, the tool loading device 152 moves FOUPs only in the vertical and X direction to load/unload FOUPs from a load port 112. It is within the scope of the present invention to move the FOUP again in the Y direction to, for example, align the FOUP on the FOUP advance plate of a load port 112.

Figure 7A:
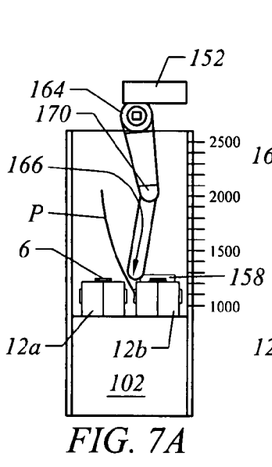
FIGS. 7A-7J provide various schematic views of an embodiment of the tool loading device in operation.
Figure 7B:
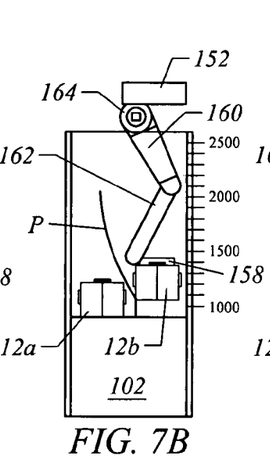
Figure 7C:
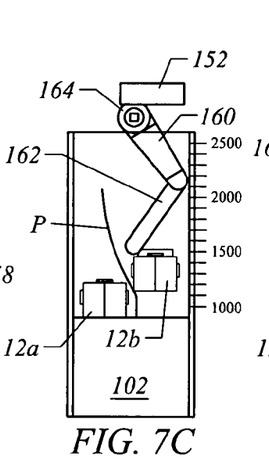
Figure 7D:
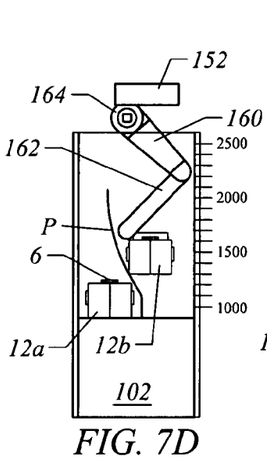
Figure 7E:
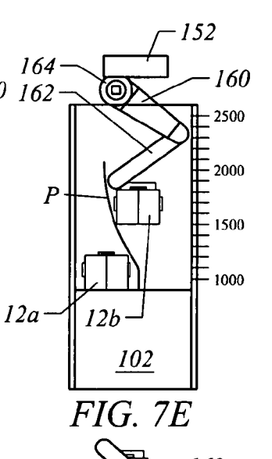
Figure 7F:
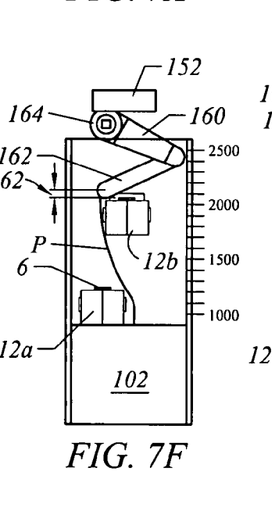
Figure 7G:
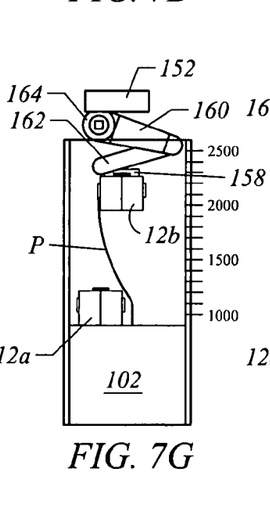
Figure 7H:
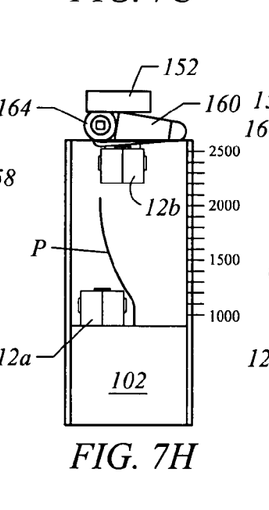
Figure 7I:
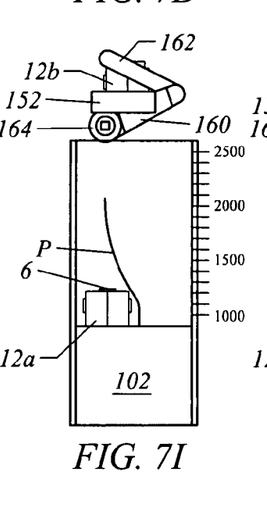
Figure 7J:
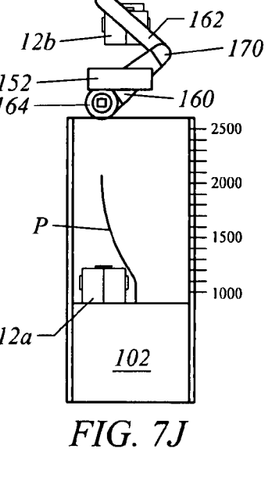

FIGS. 7A-7J illustrate various positions of the tool loading device 152. FIG. 7A illustrates the tool loading device 152 engaging the FOUP 12b seated on the load port of processing tool 102. The load port of the tool 102 conforms to the SEMI standard requiring FOUPs to be stored at a 900 mm height from the facility floor. In this embodiment, the gripper device 158 grips the top handle of the FOUP 12b. It is within the scope of the present invention for the gripper device 158 to grip other parts of the FOUP such as, but not limited to, the side handles or bottom flange. FIGS. 7B-7H illustrate that the tool loading device 156 lifts the FOUP 12b along a path P. In this embodiment, the FOUP 12b is initially raised substantially vertically to avoid contacting the adjacent FOUP 12a. After the FOUP 12b reaches at certain height, the coordinated motion of the arms 160 and 162 of the tool loading device 162 move the FOUP 12b upward along the path P. FIG. 7I illustrates that the tool loading device 156 moves the FOUP 12b to a height above the device's body 151. FIG. 7J illustrates that the tool loading device 152 moves the FOUP 12b to a height appropriate for loading the FOUP 12b onto either the input conveyor stub or the exit conveyor stub.

The tool loading device 152 provides several advantages over an OHT system. A belt-hoist mechanism, which is often used in an OHT system to move containers vertically, requires an unobstructed vertical path above each load port. A rigid link mechanism allows greater utilization of available vertical space in the process tool bay for buffering or storage of containers. It is desirable to use rotary joints in a rigid link mechanism because rotary joints are mechanically simpler, more reliable, and less expensive than linear (sliding) joints. Other types of joints may also be used for the tool loading device 152.

When comprising a rigid link mechanism, it is preferable to use the least number of, and the shortest possible links or arms, to accomplish the required motion to minimize the rotary inertia, and power required to actuate, the links 160a and 162 of the tool loading device 152. Thus, the first rotary joint 164 is preferably located near the center of the vertical range of travel of the arms 160 and 162 of the tool loading device 152. This location of the first rotary joint 164 prevents each link or arm 160, 162 from having to extend substantially more than one-half the total travel length between a conveyor and the load port.

Many of the material transport interfaces located in a semiconductor fabrication facility are carefully defined by industry standards (e.g., SEMI Standards). It is desirable to comply with these standards to ensure that the tool loading device 152 is compatible with as many process tools as possible. In the case of the tool loading device 152 handing off to a 300 mm process tool, SEMI Standard E15.1 defines the space above the process tool load 112 port that must be made available for movement of a handling robot. Particularly, E15.1 defines a chimney-like space through which an OHT vehicle may raise and lower a container (e.g., a 300 mm FOUP). This space is defined as 580 mm wide (centered across the tool 102 face), 450 mm deep (extending out from the tool 102 face) and 2600 mm tall (from the raised fabrication facility floor)—for each load port 112. It is desirable that the tool loading device 152 is capable of complying with the E15.1 standard by working within this space when accessing a load port 112. Complying with the E15.1 standard places significant restrictions on the geometry of the tool loading device 152.

Fortunately, in practice, most process tools do not have obstructions in the space around and above load ports—with the exception that most tools include side barrier panels at the edges of the tool to prevent accidental operator access. The SEMI standard E15.1 requires that these panels must be at least 290 mm distant from the load port centerline and allows the side panels to extend up to 2600 mm above the facility floor. Further, it is very rare to encounter a process tool with only a single load port. Process tools often have 2, 3, or 4 load ports. This means that most load ports have at most one significant obstacle nearby—a side barrier located to one side of the load port.

The tool loading device 152 is able to avoid this obstacle when delivering a FOUP 12 to each load port 112. The center of rotation of the first rotary joint 164 is therefore preferably greater than 2600 mm from the fabrication facility floor so that the first rotary joint 164 will not contact a side barrier. It is within the scope and spirit of the present invention for the first rotary joint 164 to be located at other heights.

SEMI standards also define the elevation from the facility floor for the load port kinematic plate and the height of a FOUP (from the bottom surface of the FOUP contacting the kinematic plate to the FOUPs top handle). Thus, the minimum height that the gripper 158 of the tool loading device 152 must access is approximately 1225 mm above the facility floor. By way of example only, if the first rotary joint 164 is located at 2700 mm from the facility floor, the reach of the arms 160 and 162 (including the length of the gripper 158) of the tool loading device 152 must be a minimum of 1475 mm to reach a FOUP seated on a kinematic plate. If the first rotary joint 164 is located at a higher or lower elevation from the facility floor, the arms 160 and 162 (plus the extension of the gripper 158) will vary.

Various linkages could be developed to achieve the range of motion discussed above. For example, a single rotating link or arm with a gripper at the distal end would provide a simple mechanism to accomplish this range of motion. However, a single arm or link would have a very large rotational inertia and would sweep out a circle of more than 1.5 m diameter, which may be undesirable working at the end of a bay near a facility wall. Further, a single arm may need to rotate in opposite directions to access tool load ports with side barriers to the left side versus accessing tool load ports with side barriers on the right.

Adding a second link or arm provides a linkage with smaller segments (a linkage commonly used in industrial robots), which when both links have the same length, provides advantages over a single link arm. For example, the furthest distal joint may be retracted to pass over the first joint by folding the second link back over the first. Further, such linkages may be mechanically constrained to retract the gripper 158 or payload along a straight path, such that this seemingly complex motion may be driven by a single motor. More than two links are also within the scope of the present invention.

The tool loading device 152 preferably maintains the horizontal orientation of the substrates stored in the container at all times during transport between, for example, an input conveyor stub 118 and a load port 112. Thus, the movement of the arms 160 and 162 are coordinated to effectively maintain the gripper 158 in a fixed horizontal orientation.

The vertical offset 168 between the FOUP handle 6 and the rotating joint 166 of the arm 162 has the desirable effect of shortening the lengths of the arms 160 and 162 required for the gripper 158 to grip the FOUP handle 6. However, because the gripper orientation is preferably horizontal at all times, the offset 168 reduces the maximum height that the tool loading device 156 can place a FOUP on a conveyor or shelf. Conventional facility ceiling heights are approximately four meters. Conventional process tool move-in clearance heights are as much as three meters. This restricts the space available for, by way of example only, permanently installed storage shelves and ceiling-based conveyors (e.g., a conveyor that transports FOUPs at an elevation higher than the loading height of a load port). The tool loading device 152 preferably may pass a FOUP above another FOUP resting on, for example, a shelf or conveyor.

If the tool loading device 152 comprises a two-link mechanism, and given the constraints discussed above (e.g., side panels, etc.), the length of each arm 160 and 162 will comprise a small range of preferable link lengths. Two-link mechanisms may be difficult to control near full extension. In one embodiment, the tool loading device 152 restricts the extension of the arms 160 and 162 to 10 degrees from full extension (e.g., full extension occurs when the first arm 160 and the second arm 162 are in line). In this embodiment, a minimum link length of each arm 160 and 162 is approximately 675 mm in order to accomplish the desired range of motion of the tool loading device 152.

It is desirable to access each load port without the complexity of re-orienting the elbow joint 170. FIGS. 7A-7D illustrate the advantages to having an offset gripper 158. If the gripper 158 was centered horizontally about the rotating joint 166, the gripper 158 becomes impractical to access a load port with the side barrier on the elbow side. Particularly if there is a FOUP 12 present on the adjacent load port. Thus, it is necessary to offset the gripper 158 horizontally towards the elbow joint 170 to draw the elbow joint 170 away from the side barrier. In one embodiment, the potential of colliding with the opposite side barrier limits the amount of offset possible to approximately 210 mm. At the same time, a minimum value of 150 mm is preferable to provide elbow joint 170 clearance while maintaining clearance to the next adjacent FOUP.

A collision between the elbow joint 170 and the side barrier may still result if the side barrier is between 2000 mm and 2600 mm tall. Because these side barriers are for human safety they are commonly less than 2000 mm tall. But there are numerous exceptions. It becomes useful to consider first moving the car 151 horizontally to draw the elbow joint 170 away from a side barrier that is greater than 2000 mm high. For example, it can be shown that a horizontal motion of no more than 300 mm of each arm is approximately 725 mm. The amount of horizontal motion required by the car 151 is slightly reduced by shorter arm lengths, and is slightly increased by longer arm lengths. It is further desirable to maintain the ability to access the load port with only vertical motion when the tool side barrier heights are up to 2000 mm. Thus, the length of each arm is preferably limited to a range of 725 mm-775 mm. This range if arm lengths is, of course, only suggestive.

The tool loading device 152 may also include safety features. For example, the device 152 may include one or more motion sensors adapted to sense the presence of a human operator or piece of equipment that comes within a predetermined distance of the gripper. If a sensor detects an operator, for example, the control system will immediately stop all motion of the tool loading device 152.

It should be appreciated that the above-described mechanisms and process for FOUP transport are for explanatory purposes only and that the invention is not limited thereby. Having thus described a preferred embodiment of a method and system for transporting FOUPs, it should be apparent to those skilled in the art that certain advantages of the within system have been achieved. It should also be appreciated that various modifications, adaptations, and alternative embodiments thereof may be made within the scope and spirit of the present invention. For example, the use of conveyors has been illustrated in a semiconductor fabrication facility, but it should be apparent that many of the inventive concepts described above would be equally applicable to the use of other non-semiconductor manufacturing applications.

The invention claimed is:

1. In a transport system for transporting a container into a tool bay by a first material transport system and transporting a container out of the tool bay by a second material transport system, where the tool bay includes a floor and at least one processing tool having a load port, a tool loading device comprising:
    a track having a first end and a second end; and
    a container transport device for moving a container between the first transport system, a load port and the second transport system, including:
        a body being adapted to travel between said first end and said second end of said track;
        a gripper for securing and releasing a container; and
        an arm assembly that comprises a first link and a second link, rotatably secured to said body, being adapted to move said gripper through substantially only a combination of Z-direction motion and X-direction motion within a common vertical pane.

2. The tool loading device as recited in claim 1, wherein said gripper is rotatably secured to said second link.

3. The tool loading device as recited in claim 1, wherein said first link is substantially the same length as said second link.

4. The tool loading device as recited in claim 1, wherein said first, link is rotatably secured to said body of said container transport device.

5. The tool loading device as recited in claim 1, wherein said container transport device is able to sense the presence of a human operator within a specific distance of said arm assembly or said ripper.

6. The tool loading device as recited in claim 1, wherein the motion of said second link depends on the motion of said first link.

7. The tool loading device as recited in claim 1, wherein said track is offset, in the Y-direction, from both the first material transport system and the second material transport system.

8. The tool loading device as recited in claim 1, wherein said track is substantially aligned, in the Y-direction, with both the first and second material transport systems.

9. The tool loading device as recited in claim 1, wherein the vertical height of said track, measured from the tool bay floor, is less than the vertical height of either said first material transport system or said second material transport system.

* * * * *